(12) United States Patent
Howell et al.

(10) Patent No.: US 6,478,588 B1
(45) Date of Patent: Nov. 12, 2002

(54) CPU SOCKET ASSEMBLY WITH PICK UP CAP

(75) Inventors: David Gregory Howell, Gilbert, AZ (US); Yo Chi Huang, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/041,063

(22) Filed: Dec. 28, 2001

(51) Int. Cl.$^7$ ................................................ H01R 13/44
(52) U.S. Cl. ........................................ 439/135; 439/940
(58) Field of Search ................................ 439/940, 342, 439/135

(56) References Cited

U.S. PATENT DOCUMENTS 5,055,971 A * 10/1991 Fudala et al. ............... 439/940
5,361,492 A * 11/1994 Miyazawa .................. 439/135
5,899,760 A * 5/1999 Ho et al. .................... 439/940
6,155,848 A * 12/2000 Lin ............................. 439/135
6,168,444 B1 * 1/2001 Wu et al. .................... 439/135

* cited by examiner

Primary Examiner—Gary Paumen
(74) Attorney, Agent, or Firm—Wei Te Chung

(57) ABSTRACT

A CPU socket assembly includes a base (20) defining an array of contact passageways (21), a plurality of conductive contacts (50) received in the contact passageways, a cover (10) movably mounted on the base and defining an array of pin holes (11) in alignment with the contact passageways of the base and adapted for insertion of pins of a CPU, an actuator (40) disposed between the cover and the base for driving the cover to move along the base, and a pick up cap (30) positioned on the cover. The pick up cap comprises a flat plate (31) and a pair of latches (32) formed on opposite sides of the flat plate for hooking on to opposite sides of the base.

5 Claims, 4 Drawing Sheets

CPU SOCKET ASSEMBLY WITH PICK UP CAP

BACKGROUND OF THE INVENTION

1. Field of the Invention

The present invention relates to a central processing unit (CPU) socket assembly, and particularly to a CPU socket assembly with a pick up cap which can be firmly assembled to a CPU socket while permitting easy removal thereof.

2. Description of Related Art

Generally, a pick up cap is attached to a CPU socket for being sucked by a vacuum device for facilitating positioning of the CPU socket on a printed circuit board before soldering. Referring to FIG. 4, a related pick up cap 6 has an upper surface 61, a bottom surface 62, and a plurality of protrusions 63 projecting from the bottom surface 62. The protrusions 63 are adapted to be interferentially fit in a corresponding opening defined in the CPU socket.

However, the related pick up cap 6 has problems as follows. For ensuring a secure engagement between the pick up cap 6 and the CPU socket, the interference force between sidewalls of the opening of the CPU socket and the protrusions 63 should be increased. However, if the interference force is too large, it is difficult for a user to assemble/disassemble the pick up cap 6 to/from the socket and the socket may be scratched by the protrusions 63. If the interference force between the sidewalls of the opening and the protrusions 63 is reduced to facilitate assembly and disassembly of the pick up cap 6, the pick up cap 6 may disengage from the socket when sucked by the vacuum device. Thus, an improved pick up cap which can be firmly assembled to the socket and which can also be easily removed from the socket manually is required.

SUMMARY OF THE INVENTION

Accordingly, the object of the present invention is to provide a CPU socket assembly with a pick up cap which can be firmly assembled to a CPU socket and which can be easily removed manually.

In order to achieve the object set forth, a CPU socket assembly in accordance with the present invention includes a base defining an array of contact passageways, a plurality of conductive contacts received in the contact passageways, a cover movably mounted on the base and defining an array of pin holes in alignment with the contact passageways of the base adapted for insertion of pins of a CPU, an actuator disposed between the cover and the base for driving the cover to move along the base, and a pick up cap positioned on the cover. The pick up cap comprises a flat plate and a pair of latches respectively formed on opposite sides of the flat plate for hooking on to opposite sides of the base.

Other objects, advantages and novel features of the invention will become more apparent from the following detailed description when taken in conjunction with the accompanying drawings.

DETAILED DESCRIPTION OF THE INVENTION

Figure 1:
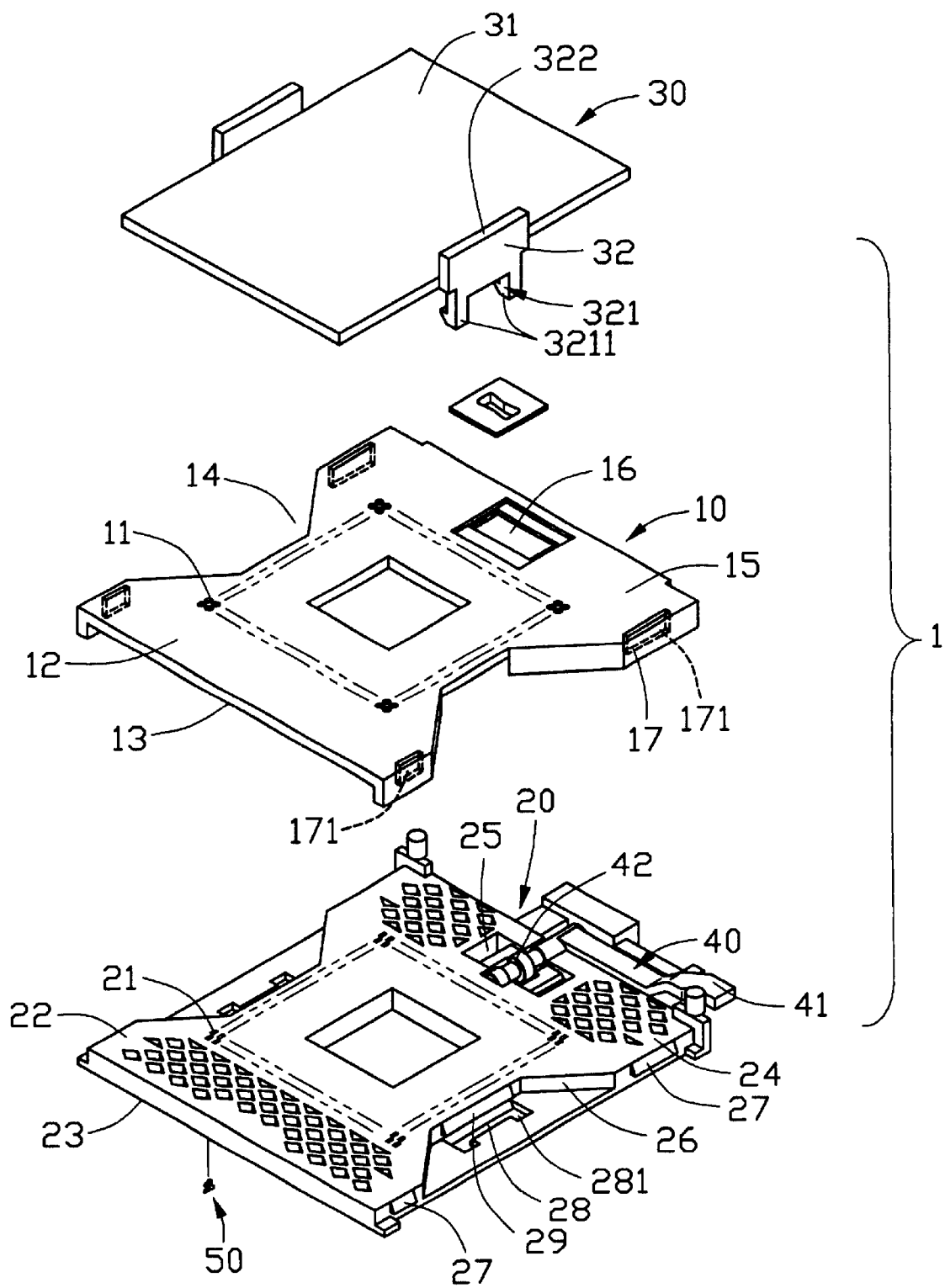
FIG. 1 is an exploded perspective view of a CPU socket assembly with a pick up cap constructed in accordance with the present invention.

Reference will now be made to the drawing figures to describe the present invention in detail.

Figure 2:
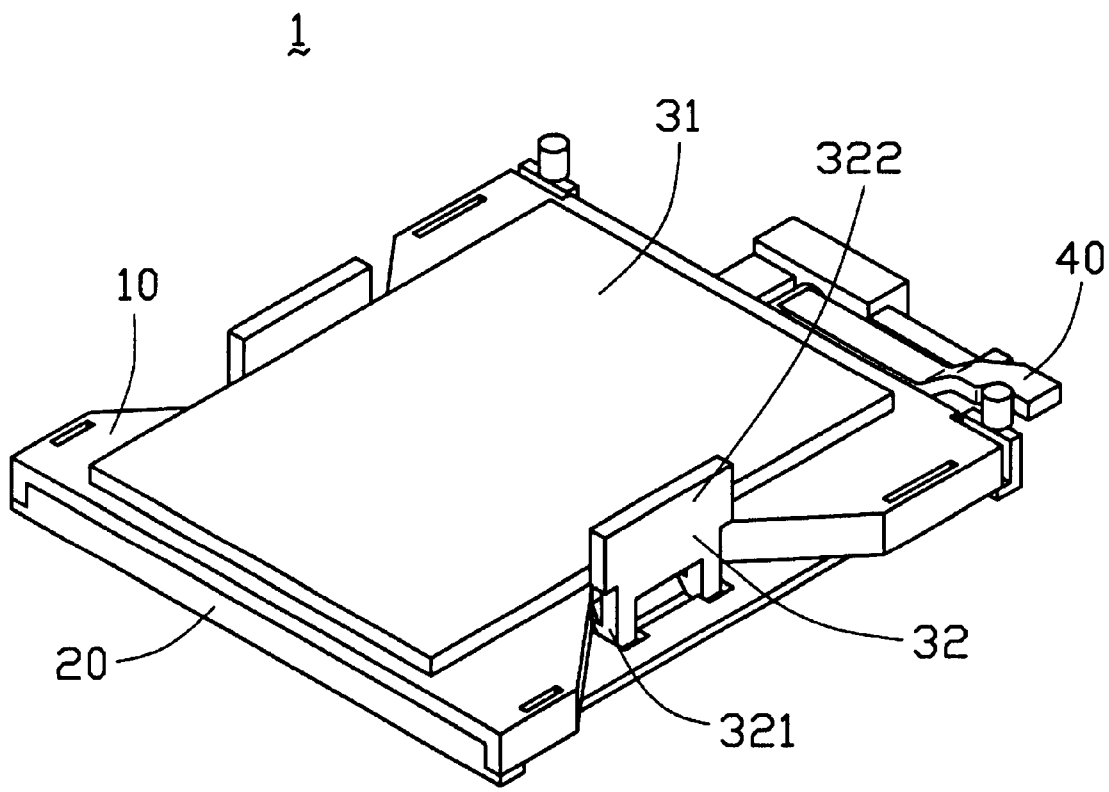
FIG. 2 is an assembled view of FIG. 1.

Referring to FIGS. 1 and 2, a CPU socket assembly 1 in accordance with the present invention comprises a CPU socket and a pick up cap 30 assembled to the CPU socket. The CPU socket includes a cover 10, a base 20, an actuator 40, and a plurality of contacts 50 received in the base 20.

The cover 10 defines a plurality of pin holes 11 through upper and bottom surfaces 12, 13 thereof for receiving pins of a central processing unit (CPU) (not shown). A pair of trapezoid recesses 14 and a pair of sidewalls 17 are provided at two opposite sides of the cover 10. Each sidewall 17 defines a pair of grooves 171 in an inner side thereof. A pair of extending plates 15 are provided at opposite ends of the cover 10. One of the extending plates 15 defines a rectangular hole 16.

The base 20 defines a plurality of contact passageways 21 through upper and lower faces 22, 23 thereof in alignment with the pin holes 11 of the cover 10 for receiving the contacts 50 therein. A pair of protruding plates 24 are formed at opposite ends of the base 20 corresponding to the extending plates 15 of the cover 10. One of the protruding plates 24 defines a rectangular hole 25 corresponding to the rectangular hole 16. Each side of the base 20 has a pair of blocks 27 and a protrusion 29 between the blocks 27. The base 20 also defines a pair of cutouts 26 corresponding to the recesses 14 of the cover 10 and a pair of slots 28 at the bottom of the respective cutouts 26. A pair of enlarged portions 281 are provided at respective opposite ends of each slot 28. The protrusions 29 project into corresponding cutouts 26. The cover 10 is movably mounted on the base 20 with the blocks 27 of the base 20 received in grooves 171 defined of the cover 10.

The actuator 40 comprises a cam shaft 42 received in the rectangular holes 25 and 16 and an operating handle 41 connecting with the cam shaft 42. By operating the actuator 40, the cover 10 can move in a horizontal direction relative to the base 20.

The pick up cap 30 comprises a rectangular flat plate 31 and a pair of latches 32 formed on opposite sides of the flat plate 31 and perpendicular to the flat plate 31. Each latch 32 comprises a pressing portion 322 connected with the flat plate 31 and a hook portion 321 downwardly extending from the pressing portion 322. Each hook portion 321 comprises a pair of opposite hooks 3211. The flat plate 31 is positioned on the cover 10 and the hook portions 321 of the latches 32 are received in the recesses 14 of the cover 10 and the slots 28 of the base 20 and hooked on to the protrusions 29 of the base 20. The secured pick up cap 30 thus can be sucked by a vacuum device (not shown) for positioning the CPU socket on a printed circuit board (not shown) for soldering.

Figure 3A:
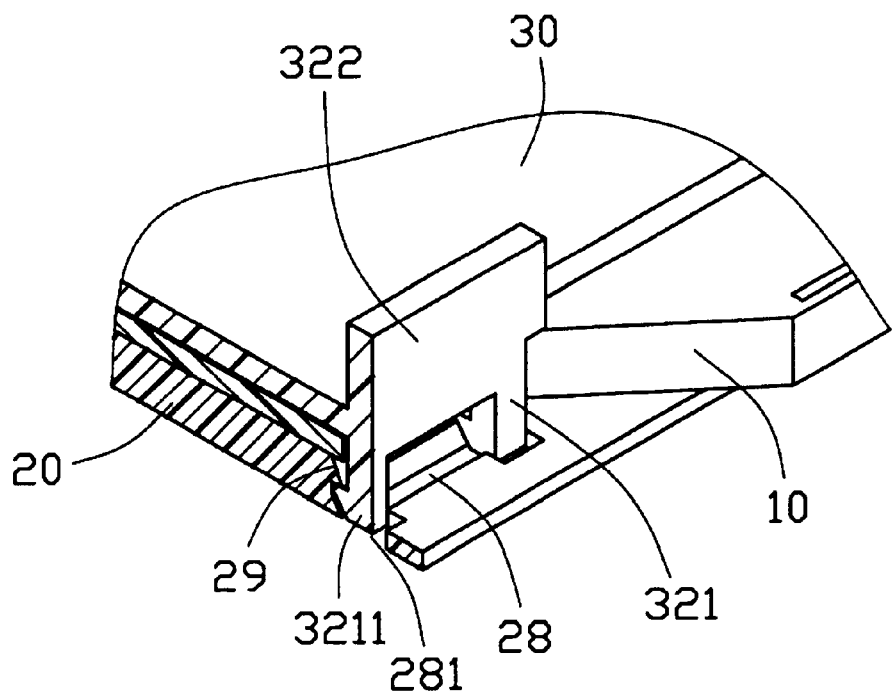
FIG. 3A is a partial, cross-sectional view of the CPU socket assembly of FIG. 2, showing the pick up cap engaged with a base of the CPU socket assembly.
Figure 3B:
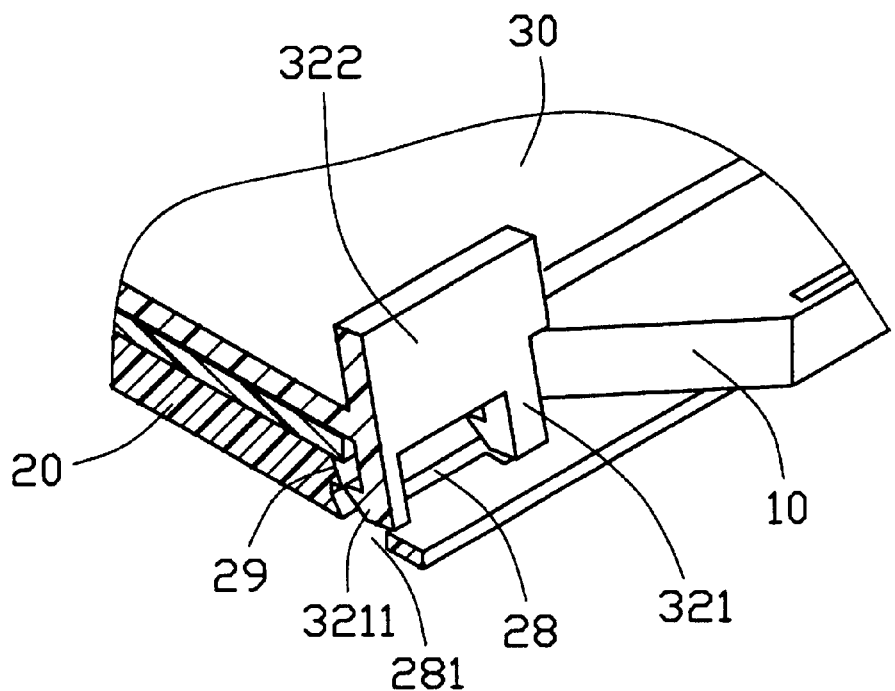
FIG. 3B is a partial, cross-sectional view of the CPU socket assembly of FIG. 2, showing the pick up cap disengaged from the base of the CPU socket assembly.
Figure 4:
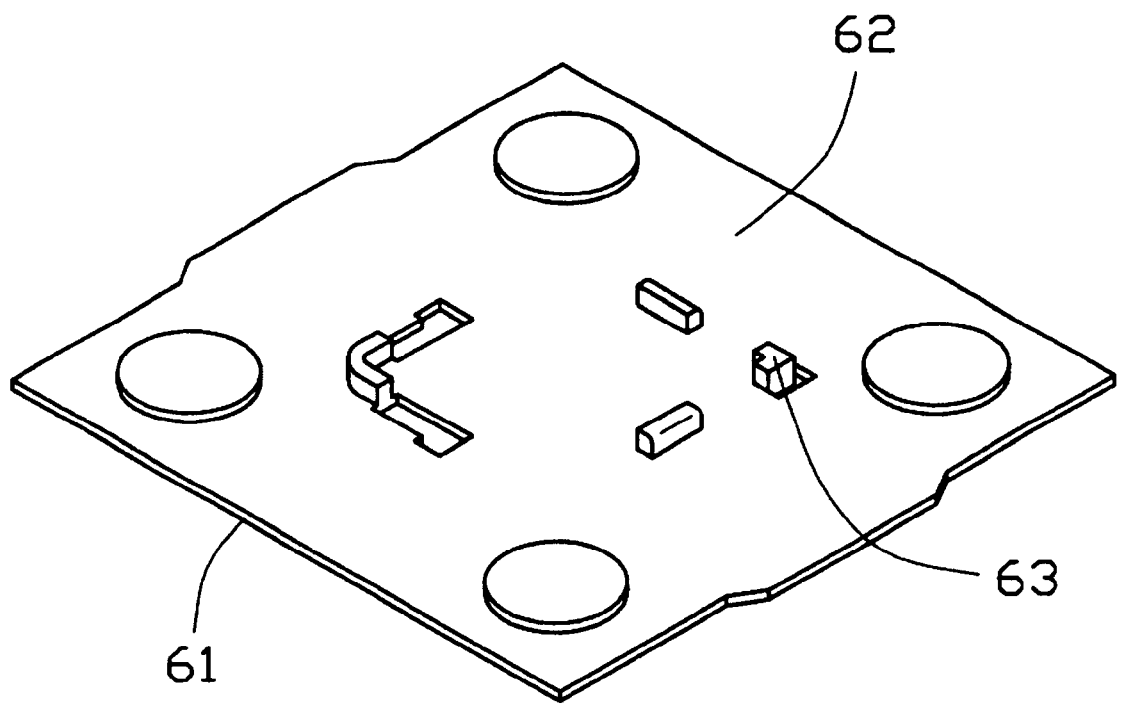
FIG. 4 is a bottom, perspective view of a related pick up cap.

Referring to FIG. 3A, the pick up cap 30 is firmly assembled to the socket by the hook portions 321 engaging with corresponding protrusions 29 and the hooks 3211 movably received in inner sections of the enlarged portions 281 of the slots 28. As shown in FIG. 3B, when removing the pick up cap 30 from the socket, the pressing portions 322 are squeezed manually toward each other, whereby the hooks 3211 are disengaged from the protrusions 29 of the base 20 and move into outer sections of the enlarged portions 281 of the slots 28 for easy removal.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical socket assembly comprising:

a base defining a plurality of contact passageways;

a plurality of conductive contacts received in the contact passageways;

a cover movably mounted on the base and defining a plurality of pin holes in alignment with the contact passageways of the base; and a pick up cap positioned on the cover, the pick up cap comprising a flat plate and a pair of latches formed on opposite sides of the flat plate for releasably engaging with opposite sides of the base, each latch comprises a pressing portion connected with the flat plate and a hook portion downwardly extending from the pressing portion;

wherein the cover defines a pair of recesses at opposite sides thereof, and the base defines a pair of cutouts in communication with corresponding recesses of the cover;

wherein the base comprises a pair of protrusions formed on opposite sides thereof and projecting into the corresponding cutouts, and the hook portions of the latches of the pick up cap engage the corresponding protrusions.

2. The socket assembly as described in claim 1, wherein the base defines a pair of slots at the bottom of the respective cutouts, each slot having a pair of enlarged portions at respective opposite ends thereof.

3. The socket assembly as described in claim 2, wherein the base comprises a pair of protrusions formed on opposite sides thereof and projecting into corresponding cutouts, and wherein each hook portion of the pick up cap comprises a pair of opposite hooks, the pair of hooks being engaged with a corresponding protrusion of the base and movably received in the enlarged portions of a corresponding slot of the base.

4. The socket assembly as described in claim 1, wherein the cover comprises a pair of downwardly extending sidewalls at opposite sides thereof, each sidewall defining a pair of grooves in an inner side thereof, and the base comprises a pair of blocks on each side thereof for being received in corresponding grooves of the cover.

5. The socket assembly as described in claim 1, further comprising an actuator disposed between the cover and the base for driving the cover to move along the base.

* * * * *